(12) United States Patent
Alvarado

(10) Patent No.: US 6,212,478 B1
(45) Date of Patent: Apr. 3, 2001

(54) COMPUTER PROGRAM FOR RAPID ESTIMATION OF SYSTEM VALUES FROM REDUNDANT CONFLICTING MEASUREMENTS

(75) Inventor: Fernando L. Alvarado, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 08/992,194

(22) Filed: Dec. 17, 1997

Related U.S. Application Data

(63) Continuation-in-part of application No. 08/588,592, filed on Jan. 18, 1996, now abandoned.

(51) Int. Cl.$^7$ ...................................................... G06F 19/00
(52) U.S. Cl. .............................. 702/64; 702/57; 702/183; 700/286
(58) Field of Search .................................. 702/64, 57–59, 702/62, 66, 71, 73, 85, 115, 118, 119, 122, 123, 189, 183–185, 193, 194, 196, 198, FOR 103, FOR 104, FOR 106, FOR 110, FOR 134, FOR 156, FOR 157, FOR 159, FOR 160, FOR 170, FOR 171; 700/286, 291–298; 708/520, 800–803, 607

(56) References Cited

U.S. PATENT DOCUMENTS

| | | | | |
|---|---|---|---|---|
| 3,379,867 | * | 4/1968 | Honnell | 708/803 |
| 4,787,057 | * | 11/1988 | Hammond | 708/607 |
| 5,206,822 | * | 4/1993 | Taylor | 708/607 |

* cited by examiner

Primary Examiner—Hal Wachsman
(74) Attorney, Agent, or Firm—Quarles & Brady

(57) ABSTRACT

A method of operating an electronic computer for pre-processing a first matrix having an array of coefficients representing linear functions relating measured variables to unmeasured variables of particular physical systems scans the rows of the matrix representations of these equations for rows with large numbers of non-zero coefficients and expands the matrix to reduce the density of those rows resulting in a larger expanded matrix that requires relatively fewer multiplication operations.

1 Claim, 1 Drawing Sheet

- INPUT MEASURED VALUES Z — 10
- INPUT DEFINING SYSTEM COEFFICIENTS A FOR VALUES X — 12
- SCAN A FOR ROWS DENSER THAN THRESHOLD — 14
- BREAK DENSER ROWS INTO NEW ROWS — 16
- SOLVE FOR X WITH EXPANDED EQUATIONS Â — 18
- OUTPUT X — 20

COMPUTER PROGRAM FOR RAPID ESTIMATION OF SYSTEM VALUES FROM REDUNDANT CONFLICTING MEASUREMENTS

CROSS REFERENCES TO RELATED APPLICATIONS

This application is a continuation-in-part of U.S. application Ser. No. 08/588,592 filed Jan. 18, 1996 (abandoned).

STATEMENT REGARDING FEDERALLY SPONSORED RESEARCH OR DEVELOPMENT

NSF Award#'s ECS-9215271 and ECS-9216308.

FIELD OF THE INVENTION

This invention relates to computer programs used to estimate values describing the state of complex systems such as commercial electrical transmission and distribution networks and the like, and in particular to a computer program that reduces the amount of time necessary for estimation of such values on current electronic computers.

BACKGROUND OF THE INVENTION

A common set of problems normally solved with the aid of an electronic digital computer are those in which measurements of a complex physical system are used to derive or estimate other values that cannot be measured directly. For example, in an electrical transmission and distribution network with known topology and electrical characteristics, the amount of power delivered to the network by some of the generating stations and certain of the line flows may be measured. From these measurements of generator power and line flows, the voltages on the network at the various sites may be derived or estimated. This in turn permits the estimation of almost any other quantity of interest, such as other unmetered flows and voltages. Measuring every flow and voltage is not practical and/or reliable.

Problems such as these may be expressed in the following matrix form $$Ax=z \quad (1)$$

Where z is a set of measured values, such as power input from generators or line flows, x is a set of unknowns, such as voltages, and A is a matrix of coefficients, based for example on the network topology and electrical characteristics, and relating the currents z to the voltages x.

Equation (1) provides a set of simultaneous equations which may be solved for values of x. Typically, the number of measured values, and hence equations, will be greater than the number of unknown values. Thus some of the measurements are redundant. Further, to the extent that the measurements are inaccurate or the physical system is not well characterized, the equations will conflict with each other. Thus, the values x will be a best fit to inconsistent measurements.

The matrix equation (1) requires that the relationships between the measured values and the unknown values be linear, however in those situations where linear relationships are not present, the equation (1) may often be used by approximating the relationship with linear equations.

A number of computerized techniques are known for estimating or optimizing values of x based on values of z and A. In one method known as "orthogonal factorization", a set of orthogonal matrices $Q_1 \ldots Q_n$ are selected that produce the matrix A when multiplied by an upper triangular matrix R, that is:

$$Q_\tau \ldots Q_3, Q_2, Q_1 R = A \quad (2)$$

or $$QR=A \quad (2')$$

where $Q_\tau \ldots Q_3, Q_2, Q_1 = Q$ (2')

The orthogonal matrices $Q_1$ through $Q_\tau$, when factored from A, concentrate the data of matrix A into the upper right hand side of the matrix as an upper triangular matrix R. In some cases, the product of those Q matrices can be combined into a single orthogonal matrix Q. An upper triangular matrix is a matrix where all non-zero coefficients are on or above the diagonal from the northwest corner of the matrix to the southeast corner of the matrix. The upper triangular matrix R can be readily solved for values of x using the technique of back substitution as will be described below and as is well known in the art.

Thus, for example, a simple physical system may have unknown variables $x_1$ through $x_4$, and measured variables $z_1$ through $z_5$, having values of 1, −1, 1, −1, and 1, respectively. The properties of the physical system may be described by coefficients (in this case values of one or zero) in a matrix A of four columns and five rows as shown in equation (3) below.

$$\begin{bmatrix} 1 & & & \\ & 1 & & \\ & & 1 & \\ & & & 1 \\ 1 & 1 & 1 & 1 \end{bmatrix} \begin{bmatrix} x_1 \\ x_2 \\ x_3 \\ x_4 \end{bmatrix} = \begin{bmatrix} 1 \\ -1 \\ 1 \\ -1 \\ 1 \end{bmatrix} \quad (3)$$

For clarity, coefficients of zero in matrix A are omitted.

Following the normal rules for matrix multiplication, equation (3) represents the following simultaneous linear equations:

$$x_1 = 1 \quad (4a)$$

$$x_2 = -1 \quad (4b)$$

$$x_3 = 1 \quad (4c)$$

$$x_4 = -1 \quad (4d)$$

$$x_1 + x_2 + x_3 + x_4 = 1 \quad (4e)$$

Note that these equations are conflicting in that the values of $x_1$ through $x_4$ provided in the first four equations (4a)–(4d), if summed, do not equal the value of the fifth equation.

To solve the equations (4a)–(4e) for values of x (in this case, values of x that are in "least squares" best agreement with the conflicting equations (4a)–(4e)), the matrix A may be factored by a matrix Q as follows:

$$Q = \begin{bmatrix} -0.7071 & 0.4082 & 0.2287 & 0.2236 & -0.4472 \\ 0 & -0.8165 & 0.2887 & 0.2236 & -0.4472 \\ 0 & 0 & -8.660 & 0.2236 & -0.4472 \\ 0 & 0 & 0 & -0.8944 & -0.4472 \\ -0.7071 & -0.4082 & -0.2887 & -0.2236 & -0.4472 \end{bmatrix} \quad (5)$$

Where Q is determined by techniques well known in the art and described generally in Philip E. Gill et al., *The*

*Orthogonal Factorization of a Large Sparse Matrix*, in "Sparse Matrix Computations", edited by J. R. Bunch et al., Academic Press (1976), hereby incorporated by reference. This orthogonal factorization produces an upper triangular matrix R as follows:

$$R = \begin{bmatrix} -1.4142 & -0.7071 & -0.7071 & -0.7071 \\ & -1.2247 & -0.4082 & -0.4082 \\ & & -1.1547 & -0.2887 \\ & & & -1.1180 \end{bmatrix} \quad (6)$$

where the information from matrix A has been concentrated into the upper diagonal half of the matrix R. R may be used to solve for the values of x by back substitution. From equations (1) and (2'):

$$QRx=z \quad (7)$$

$$Rx=Q'z \quad (8)$$

where Q' is the transposition of Q which for orthogonal matrixes is equal to the inverse of Q. In this case:

$$w = Q'z = \begin{bmatrix} -1.4142 \\ 0.8165 \\ -1.1547 \\ 0.8944 \\ 0.4472 \end{bmatrix} \quad (9)$$

Hence:

$$\begin{bmatrix} -1.4142 & -0.7071 & -0.7071 & -0.7070 \\ & -1.2247 & -0.4082 & -0.4082 \\ & & -1.1547 & -0.2887 \\ & & & -1.1180 \end{bmatrix} \begin{bmatrix} x_1 \\ x_2 \\ x_3 \\ x_4 \end{bmatrix} = \begin{bmatrix} -1.4142 \\ 0.8165 \\ -1.1547 \\ 0.8944 \\ 0.4472 \end{bmatrix} \quad (10)$$

Following the rules of matrix multiplication, the lower most row of matrix R provides the expression $1.1180x_4 = 0.8944$. Thus $x_4$ may be readily solved and substituted into an equation produced by the next to the last row of matrix R and so forth for all the equations represented by expression (10).

In this example, the following values of $x_1$ through $x_4$ are produced:

$x_1 = 1.2$ $x_2 = -0.8$ $x_3 = 1.2$ $x_4 = -0.8$

Note that these values differ from those indicated by equations (4a)–(4d) because they are a least squares approximation satisfying all of equations (4a)–(4e).

The process of solving for the values of $x_1$–$x_4$ by back substitution of the matrix R requires ten multiplications because there are ten non-zero coefficients in R. In some current electronic computers, multiplications are a time consuming operation especially if high precision is required. Accordingly it is desirable to reduce the number of multiplication operations necessary to solve these types of problems.

SUMMARY OF THE INVENTION

The present invention adds rows and columns to the coefficient matrix A prior to solving for the unknown values x. Although this makes the matrix A larger, for many matrices representing complex physical systems, the larger matrix A ultimately requires fewer multiplications by the electronic computer and hence is significantly faster.

Specifically, the invention provides a program for controlling an electronic computer communicating with a computer memory. The program instructs the computer to store in the computer memory a series of measured values of a physical system as a multi-row measurement array z. The program also instructs the computer to store in the computer memory a series of coefficients, as a coefficient matrix A having multiple rows and columns, relating the measured values z to a plurality of unmeasured values x such that Ax=z. The rows of the coefficient matrix A are then scanned for rows having a greater than a predetermined minimum number of non-zero coefficients. These rows are broken into two rows to create an equivalent matrix Â that is equivalent to matrix A as far as describing the physical system. The equivalent matrix is then solved by conventional techniques on the electronic computer and the values of z are output.

It is one object of the invention to limit the number of multiplications necessary to deduce unmeasured values from measured values of a physical system. Making a larger matrix Â in fact decreases the number of multiplications for many matrices of interest, so as to radically reduce the required computer time to solve for the unmeasured values. It is a similar object of the invention to reduce computer time in solving similar problems, for example in optimization.

The breaking up of the rows may be done by moving some of the coefficients from the identified row into a new row in computer memory and creating in computer memory a placeholder unmeasured value corresponding to the new row.

Thus it is a another object of the invention to provide a simple method of breaking up dense rows of matrices to provide the execution speed advantages of the invention.

A value 0 may be loaded in the computer memory in the set of measured values in a place corresponding to the identified row. The added new rows with a fictitious measured value of zero may be constrained to be satisfied quite accurately (they are "equality constrained"). Several well known methods to accomplish this exist. In the simplest such method, the coefficients of the new row corresponding to the zero value in the set of measured values is multiplied by a predetermined large weighting number.

Thus it is another object of the invention to provide the speed benefits of the present invention without significantly affecting the accuracy of the solution. By weighting the coefficients associated with the zero value rows by a large predetermined number, the accuracy of the computations involving these coefficients is effectively increased, limiting any detrimental effects of the expansion process on the accuracy of the total computation.

In the solving of the expanded matrix, an equation of at least one of the new rows may be scaled by a scaling factor. The scaling factor may be $\sqrt{p}$ where p is the number of new rows.

Thus it is another object of the invention to provide a scaling factor ensuring a least square fit of the measured data to the solution of the equations.

The solving of the expanded matrix may be done by a number of well known computer techniques including ordinary orthogonal factorization or the semi-normal equations variant of orthogonal factorization.

Thus it is another object of the invention to provide a computer program that may operate as a simple pre-processor for data provided to existing computer programs used for the solving of problems of this type, and that may thus speed up the solving of this type of problem with conventional programs and-computers. As a pre-processor, the present invention does not require that the existing computer code be rewritten.

The foregoing and other objects and advantages of the invention will appear from the following description. In this description, reference is made to the accompanying drawings which form a part hereof and in which there is shown, by way of illustration, the preferred embodiment of the invention. Such embodiment does not necessarily represent the full scope of the invention, however, and reference must be made therefore to the claims for interpreting the scope of the invention.

DETAILED DESCRIPTION OF THE PREFERRED EMBODIMENT

Figure 1:
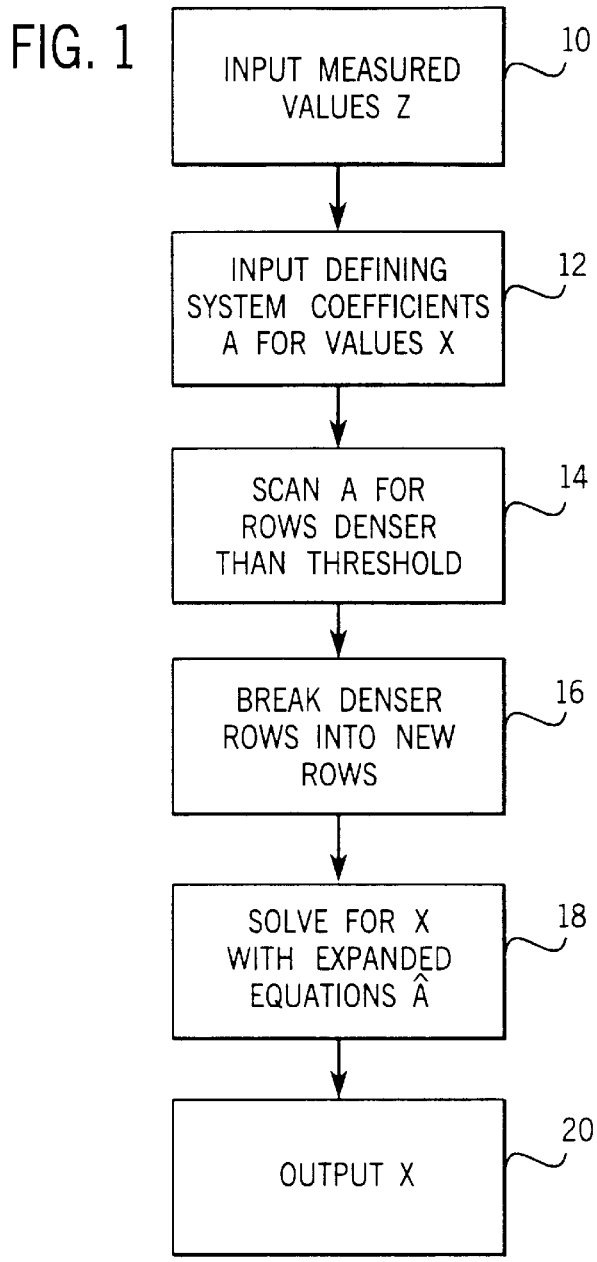
FIG. 1 is a flowchart showing the steps of the computer program of the present invention.

Referring now to FIG. 1, in a first step of the present invention, the computer program requests the input of the measured values z of the particular system being studied as indicated by process block 10. Continuing with the example described above, these input values may be an array of five values z as follows:

$$z = \begin{bmatrix} 1 \\ -1 \\ 1 \\ -1 \\ 1 \end{bmatrix} \qquad (11)$$

At process block 12, the computer program requests the input of a coefficient matrix A for a particular set of unmeasured values x, the coefficient matrix A relating the values of x to values of z according to the matrix equation Ax=z.

Per the previous example, the matrix of A for values of $x_1$–$x_4$ is:

$$A = \begin{bmatrix} 1 & & & \\ & 1 & & \\ & & 1 & \\ & & & 1 \\ 1 & 1 & 1 & 1 \end{bmatrix} \qquad (12)$$

At process block 14, the matrix A is scanned for dense rows. A dense row is a row with at least four non-zero coefficients but typically at least eight non-zero coefficients to provide the benefits of the present invention. This predetermined maximum number of non-zero coefficients will be termed the "threshold row density" and may be determined empirically by experimentation on a particular computer system with a particular solving program described with respect to process block 18 below. In the present example, the predetermined threshold row density will be considered to be four, the minimum possible threshold value.

Once dense row has been detected having a density of non-zero coefficients greater than the threshold row density, (row four in this example), that row is expanded to reduce its density. This expansion must be done in a way that does not fundamentally change the physical system being investigated; that is, solving of the new expanded matrix Â must produce a similar set of unmeasured values as the matrix A.

This expansion may be done on a row-by row basis by adding one new column to the matrix A, (in this example, a fifth column) and one new row of the matrix A, (in this case a sixth row). Half of the coefficients (or an integer approximation of half) in the identified dense row are then moved to the new row. A value of 1 is placed in the fifth column at the row of the dense row and a value of –1 is placed in the fifth column at the new row. A dummy unmeasured variable y is then added to the set of unmeasured values x and a value of 0 is added to the array measured values in the place of the dense row so that equation (3) becomes $$\begin{bmatrix} 1 & & & & \\ & 1 & & & \\ & & 1 & & \\ & & & 1 & \\ 1 & 1 & & & 1 \\ & & 1 & 1 & -1 \end{bmatrix} \begin{bmatrix} x_1 \\ x_2 \\ x_3 \\ x_4 \\ y \end{bmatrix} = \begin{bmatrix} 1 \\ -1 \\ 1 \\ 0 \\ 1 \end{bmatrix} \qquad (13)$$

This new matrix equation provides the following set of simultaneous equations that are equivalent to the equations of (4a)–(4e) described above with respect to equation (3):

$$x_1 = 1 \qquad (14a)$$

$$x_2 = -1 \qquad (14b)$$

$$x_3 = 1 \qquad (14c)$$

$$x_4 = -1 \qquad (14d)$$

$$x_1 + x_2 + y = 0 \qquad (14e)$$

$$x_3 + x_4 + -y = 1 \qquad (14f)$$

Equations (14a)–(14d) represented by this expanded matrix Â are the same as (4a)–(4d). New equations (14e) and (14f) combine to provide equation (4e). Thus the equation of the fourth row of matrix A is broken up into two rows without mathematically changing the calculation of $x_1$ through $X_4$. The solution of equation (14e) should be treated as equality constrained, meaning its computation must be quite accurate.

This process of breaking up dense rows, indicated by process block 16 of FIG. 1, may be repeated, the matrix Â, as expanded, again scanned for dense rows per process block 14 and those rows broken up per process block 18—including rows that have previously been broken up but that remain above the threshold row density. With each breaking, a new row and column is added to the matrix Â to form a new matrix Â.

Figure 2:
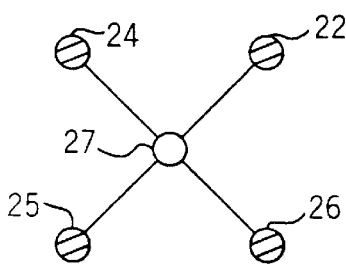
FIG. 2 is a graph of a simple electrical network such as would produce a set of measured values and system defining equations.

Referring to FIG. 2, a hypothetical network forming the basis for equation (3) and matrix A includes five nodes 22–27 with four of the nodes 22–26 arranged in a star configuration about the fifth node 27. Each of the values $x_1$ through $X_4$ may represent for example measurements of voltages of the nodes 22–26, respectively. An injection current into the center node 27, for example from a generator, may also be measured and is related to the sum of the voltages on nodes 22–26 by the topology of the network and the resistance of the lines connecting the various nodes together. The equation summing voltages $x_1$ through $x_4$ which all contribute to the current injected at node 27 forms the equation (4e).

Figure 3:
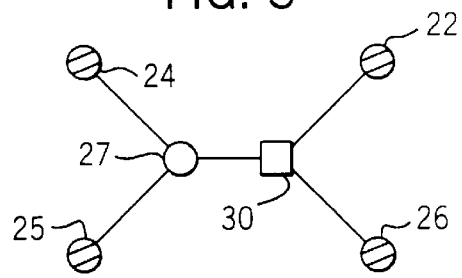
FIG. 3 is an expanded version of that graph of FIG. 2 illustrating the expansion technique of the present invention.

Referring to FIG. 3, expanding the matrix A, as described above, is equivalent to breaking node 27 into two nodes, old node 27 connected to nodes 24 and 25 and the new node 30, and the new node 30 connected to the old node 27 and to nodes 22 and 26.

The injection current at node 27 is now a function of the voltages at nodes 24, 25, and 30. The voltages at the new node 30 is in turn a function of nodes 22 and 26. The network of FIG. 3 is equivalent to the network of FIG. 2 providing the resistance of the connecting line between nodes 27 and 30 has zero resistance (as it does, effectively, in the expansion described). An arbitrarily complex graph such as shown in FIG. 2 can be broken up in this manner by splitting nodes that have four or more other nodes connected to them. Typically, however, the breaking up will be limited to nodes having more than the threshold row density number of other connected nodes so as to realize the full advantage of the present invention in reducing computational overhead of this process.

The new rows with a zero measurement are equality constrained (they must be satisfied exactly). One way to approximate this constraint is to modify the coefficients in these rows. The expanded matrix Â is weighted by multiplying the coefficients by a large constant value so that the new equation of the dense row (13e) has enhanced precision in calculation with the electronic computer (because the truncation of the calculation is effectively moved to the right by the multiplication). This enhanced precision prevents degradation of the determination of the values x that might be caused by the process of breaking the matrix rows. With a weighting factor of 100 equation (13) becomes:

$$\begin{bmatrix} 1 & & & & & \\ & 1 & & & & \\ & & 1 & & & \\ & & & 1 & & \\ 100 & 100 & & & 100 & \\ & & 1 & 1 & & -1 \end{bmatrix} \begin{bmatrix} x_1 \\ x_2 \\ x_3 \\ x_4 \\ y \end{bmatrix} = \begin{bmatrix} 1 \\ -1 \\ 1 \\ 0 \\ 1 \end{bmatrix} \quad (15)$$

The equation resulting from the weighting is simply:

$$100x_1 + 100x_2 + 100y = 0 \quad (16)$$

which is equivalent to equation (14d).

Referring again to FIG. 1 at process block 18, the matrix equation of (15) for expanded matrix Â is then solved for values of $x_1$ through $x_4$ by conventional techniques. For example, using orthogonal factorization, as described above, an orthogonal matrix Q may be obtained as follows:

$$\hat{Q} = \begin{bmatrix} -0.0100 & 0.7071 & 0 & 0 & 0.5477 & -0.4472 \\ 0 & -0.7071 & 0 & 0 & 0.5477 & -0.4472 \\ 0 & 0 & -0.7071 & 0.4082 & -0.3652 & -.04472 \\ 0 & 0 & 0 & -0.8165 & -0.3652 & -0.4472 \\ -1.0000 & -0.0071 & 0 & 0 & -0.0055 & 0.0045 \\ 0 & 0 & -0.7071 & -0.4082 & 0.3652 & 0.4472 \end{bmatrix} \quad (17)$$

This produces an upper triangular matrix R as follows:

$$\hat{R} = \begin{bmatrix} -100.005 & -99.995 & 0 & 0 & -99.995 \\ & -1.4142 & 0 & 0 & -0.7071 \\ & & -1.4142 & -0.7071 & 0.7071 \\ & & & -1.2247 & 0.4082 \\ & & & & -0.9129 \end{bmatrix} \quad (18)$$

and the value of $\hat{w} = \hat{Q}'z$ of $$\hat{w} = \begin{bmatrix} -0.01 \\ 1.4142 \\ -1.4142 \\ 0.8165 \\ 0.3652 \\ 0.4472 \end{bmatrix} \quad (19)$$

The upper triangular matrix $\hat{R}$ and the product of Q' and w may then be solved by back substitution.

Starting at the bottom non-zero row of matrix $\hat{R}$, the multiplication yields the expression $0x_1 + 0x_2 + 0x_3 0x_4 + -0.9129y = 0.3652$. Thus, y is $-0.4$. This value of y may be used in evaluating the fourth row of $\hat{R}$ which yields the expression $0x_1 + 0x_2 + 0x_3 + -1.2247x_4 + 0.4082y = 0.8165$. Since y is known, $x_4$ may be readily determined by substitution. This process continues upward through matrix $\hat{R}$ with $x_1$ and y being substituted into the evaluation of the third row and so forth. A completion of this process yields the following values.

$x_1 = 1.2$
$x_2 = -0.8$
$x_3 = 1.2$
$x_4 = -0.8$

Note that in this example the evaluation of R after expansion of A to Â required more multiplications than the evaluation of A directly. The back substitution process required for $\hat{R}$ needed eleven multiplications as opposed to ten multiplications for direct evaluation of R computed from A. Thus, it would appear that the expansion process of the present invention in fact increases the computational burden in evaluating the unmeasured values $x_1$ through $x_4$.

Referring now to Table I however, the present inventor has determined that as the size of the dense rows of matrix A increases, the computational savings from the present reconfiguration of the coefficient matrix becomes significant and provides a net savings in calculation time.

TABLE I

|  | Threshold | Rows | Columns | Multiplications |
| --- | --- | --- | --- | --- |
| Original | 4 | 1993 | 1993 | 1985028 |
| Expanded | 4 | 4879 | 4879 | 22248 |

TABLE I-continued

|  | Threshold | Rows | Columns | Multiplications |
|---|---|---|---|---|
| Original | 4 | 10595 | 4929 | 90125 |
| Expanded | 4 | 13329 | 7663 | 89799 |
| Original | 5 | 1033 | 320 | 3944 |
| Expanded | 5 | 1033 | 320 | 3944 |
| Original | 6 | 1034 | 320 | 102400 |
| Expanded | 6 | 1193 | 479 | 6011 |

Referring to Table I, for a 1993 by 1993 square matrix A, 1,985,028 multiplications are required during the back substitution step of process block 18. In contrast, the solving of the expanded matrix Â requires only 22248 multiplications, an almost 100 times reduction.

In an alternative embodiment, instead of equality constraining the new rows, they may be scaled by a factor k as follows:

$$\begin{bmatrix} 1 & & & & \\ & 1 & & & \\ & & 1 & & \\ & & & 1 & \\ k & k & & k & \\ & & k & k & -k \end{bmatrix} \begin{bmatrix} x_1 \\ x_2 \\ x_3 \\ x_4 \\ y \end{bmatrix} = \begin{bmatrix} 1 \\ -1 \\ 1 \\ 1/k \\ 1/k \end{bmatrix} \quad (20)$$

where equation (20) is the equation (13) with scaling applied to the new rows. For a least squares fit, the present inventor has determined that the value of k should be the square root of the number of new rows or $\sqrt{p}$ where p is the number of new rows, 2 in the case of equation (20).

Consider a general matrix equation (21) analogous to equation (1)

$$\begin{bmatrix} A_1 \\ A_2 \end{bmatrix} [x] = \begin{bmatrix} b_1 \\ b_2 \end{bmatrix} \quad (21)$$

where the matrix with terms A is of dimension m by n. A splitting of row m may be performed as described above to produce the following equation (22):

$$\begin{bmatrix} A_1 & 0 \\ kA_2 & k \\ kA_3 & -k \end{bmatrix} \begin{bmatrix} x \\ s \end{bmatrix} = \begin{bmatrix} b_1 \\ b_2/\mu \\ b_2/\mu \end{bmatrix} \quad (22)$$

where s is an arbitrary scalar variable, k is the scaling weight and a constant, and 0 (italicized) is a vector of zeros of dimension m−1, and $A_3$ and $A_4$ are row vectors of dimension n that satisfy the following properties:

$$A_3 + A_4 = A_2$$

and $$A_3^t A_4 = 0$$

where $A_3^t$ is the transposition of $A_3$.

The normal equations corresponding to matrix equation (21) are:

$$\begin{bmatrix} A_1^t A_1 + k^2 & A_3^t A_3 + k^2 A_4^t A_4 & k^2 A_3^t - k^2 A_4^t \\ & k^2 A_3^t - k^2 A_4^t & 2k^2 \end{bmatrix} \begin{bmatrix} x \\ s \end{bmatrix} = \begin{bmatrix} A_1^t b_1 + \frac{k}{\mu} A_3^t b_2 + \frac{k}{\mu} A_4^t b_2 \\ 0 \end{bmatrix} \quad (23)$$

The conditions to establish equality between the original equations and the stretched weighted equations can be obtained by recognizing that:

$$s = \frac{1}{2} A_3 x + \frac{1}{2} A_4 x$$

Elimination of s from the stretched equations, equating terms on the resulting left side matrix recognizing the relationships between $A_2$, $A_3$, and $A_4$ results in the following requirement:

$k = \sqrt{2}$

Similarly the right hand sides results in:

$\mu = k$

For a general p-way partition:

$k = \sqrt{p}$

The above description has been that of a preferred embodiment of the invention. It will occur to those that practice the art that many modifications may be made without departing from the spirit and scope of the invention. For example, the same techniques may be used in optimization problems. Also other techniques for solving the expanded equations (13) per process block 18 such as various versions of orthogonal factorization (including the semi-normal equations variant and Householder variants) or methods based on Hachtel blocked variants and others may be used. In order to appraise the public of the various embodiments that may fall within the scope of the invention, the following claims are made.

I claim:

1. A method to determine voltage levels in a commercial electrical network, the method comprising the steps of:

(i) collecting a series of measured electrical values at first locations in the network;

(ii) store in a computer memory the series of measured electrical values at first locations in the network to provide a multi-row electrical measurement array z;-

(iii) storing in the computer memory a series of coefficients relating the measured electrical values to a plurality of unmeasured voltage values x of the electrical network, at second locations in the electrical network, such that $Ax=z$, the coefficients forming a coefficient matrix A having multiple rows and columns;

(iv) scanning with a computer the rows of the coefficient matrix A for selected rows having greater than a predetermined minimum number of non-zero coefficients;

(v) instructing the computer to break the selected rows into new rows to create an expanded matrix $\hat{A}$ equivalent to A;

(vi) solving with the computer the expanded matrix $\hat{A}$ for the values of x;

(vii) outputting the voltage values of x determined from the expanded matrix; and (viii) adjusting the network according to the determined voltage values.

* * * * *

UNITED STATES PATENT AND TRADEMARK OFFICE
CERTIFICATE OF CORRECTION

PATENT NO. : 6,212,478 B1
DATED : April 3, 2001
INVENTOR(S) : Fernando L. Alvarado Page 1 of 1

It is certified that error appears in the above-identified patent and that said Letters Patent is hereby corrected as shown below:

<u>Column 2,</u>
Line 8, "$Q_3,Q_2,Q_1=Q(2')$" should be -- $Q_3,Q_2,Q_1=Q$ --.

<u>Column 5,</u>
Line 4, "and-computers" should be -- and computers --.

<u>Column 8,</u>
Line 31, "$0x_1+0x_2+0x_30x_4+-$" should be -- $0x_1+0x_2+0x_3+0x_4+$ --.
Line 32, "$0.9129y$" should be -- $-0.9129y$ --

Signed and Sealed this

Twenty-ninth Day of January, 2002

Attest:

*Attesting Officer*

JAMES E. ROGAN
*Director of the United States Patent and Trademark Office*